(12) United States Patent
Morimoto et al.

(10) Patent No.: US 10,411,671 B2
(45) Date of Patent: Sep. 10, 2019

(54) CRYSTAL ELEMENT AND CRYSTAL DEVICE

(71) Applicant: KYOCERA CRYSTAL DEVICE CORPORATION, Yamagata (JP)

(72) Inventors: Yusuke Morimoto, Yamagata (JP); Shiro Miyazaki, Yamagata (JP)

(73) Assignee: KYOCERA CORPORATION, Kyoto-Shi (JP)

( * ) Notice: Subject to any disclaimer, the term of this patent is extended or adjusted under 35 U.S.C. 154(b) by 302 days.

(21) Appl. No.: 15/210,146

(22) Filed: Jul. 14, 2016

(65) Prior Publication Data

US 2017/0279431 A1 Sep. 28, 2017

(30) Foreign Application Priority Data

Mar. 28, 2016 (JP) .................................. 2016-063932

(51) Int. Cl.
*H03H 9/02* (2006.01)
*H01L 41/053* (2006.01)
*H03H 9/17* (2006.01)
*H03H 9/10* (2006.01)

(52) U.S. Cl.
CPC ....... *H03H 9/02157* (2013.01); *H01L 41/053* (2013.01); *H03H 9/1021* (2013.01); *H03H 9/17* (2013.01); *H03H 9/177* (2013.01)

(58) Field of Classification Search
CPC ..... H03H 9/17; H01L 41/053; H01L 41/0933; H01L 41/094
See application file for complete search history.

(56) References Cited

U.S. PATENT DOCUMENTS

| 4,267,479 A * | 5/1981 | Kato ....................... G04F 5/063 310/348 |
| 2003/0020564 A1* | 1/2003 | Nishimura ........... H03H 9/0207 333/187 |
| 2013/0063002 A1* | 3/2013 | Mizusawa ............ H03H 9/0595 310/365 |

(Continued)

FOREIGN PATENT DOCUMENTS

| JP | 2013-197621 | 9/2013 |
| JP | 2014-179774 | 9/2014 |
| JP | 2015-186240 | 10/2015 |

*Primary Examiner* — Bryan P Gordon
(74) *Attorney, Agent, or Firm* — Greenblum & Bernstein, P.L.C.

(57) ABSTRACT

The crystal element includes: a mesa-shaped crystal piece in a substantially rectangular shape in a plan view including an oscillation section having a first protruded section and a second protruded section; excitation electrodes provided on both main surfaces of the oscillation section; leading sections provided side by side along a prescribed side of the crystal piece; and a wiring section connecting between the excitation electrodes and the leading sections. The first protruded section and the second protruded section include sloping side faces. The side face of the first protruded section located on the +X-side overlaps with the side face of the second protruded section located on the +X side, and the side face of the first protruded section located on the −X-side overlaps with the side face of the second protruded section located on the −X side.

5 Claims, 6 Drawing Sheets

(56) References Cited

U.S. PATENT DOCUMENTS

| | | | |
|---|---|---|---|
| 2016/0079955 A1* | 3/2016 | Lee | H03H 3/02 |
| | | | 310/321 |
| 2016/0099401 A1* | 4/2016 | Matsugi | H03H 9/02102 |
| | | | 310/321 |
| 2016/0226445 A1* | 8/2016 | Yamashita | H03H 9/177 |

* cited by examiner

CRYSTAL ELEMENT AND CRYSTAL DEVICE

BACKGROUND OF THE INVENTION

1. Field of the Invention

The present invention relates to a crystal element and a crystal device that is provided with the crystal element. The crystal device is a crystal vibrator or a crystal oscillator, for example.

2. Description of the Related Art

The crystal element is configured with a crystal piece that is a mesa type and in a substantially rectangular shape in a plan view and a metal pattern provided on the crystal piece, for example. The metal pattern is configured with a pair of excitation electrodes, a pair of leading sections, and a pair of wiring sections. The pair of excitation electrodes is provided on both main surfaces of the crystal piece. The pair of leading sections is for mounting the crystal element to an element loading member, and disposed in opposition to a loading pad of the element loading member. One end of the pair of wiring sections is connected to the excitation electrodes, and the other end thereof is connected to the leading sections. Through electrically connecting the leading section and the loading pad of the element loading member via a conductive adhesive, the crystal element is supported like a cantilever beam and mounted to the element loading member.

The crystal piece used for such crystal element includes, for example, an oscillation section containing a pair of protrusions projected to mutually opposing directions, and a peripheral section that is thinner than the thickness of the oscillation section and provided along an outer edge of the oscillation section. In this case, the long side of the crystal piece is in parallel to the X-axis that is one of the crystalline axes of the crystal piece. Meanwhile, the short side of the crystal piece is in parallel to the Z'-axis that is rotated from the Z-axis that is one of the crystalline axes of the crystal piece. One of the protrusions includes a side face sloping with respect to the main surface of the protrusion itself and a side face perpendicular to the main surface of the protrusion itself in a sectional view taken along the thickness direction of the crystal piece facing in the direction in parallel to the Z'-axis. The other protrusion includes a side face sloping with respect to the main surface of the other protrusion itself and a side face sloping with respect to the main surface of the other protrusion itself in a sectional view taken along the thickness direction of the crystal piece facing in the direction in parallel to the Z'-axis. In a plan view taken along the thickness direction, the crystal pieces are disposed in such a manner that the side face sloping with respect to the main surface of one of the protrusions overlap with the side face perpendicular to the main surface of the other protrusion while the side face perpendicular to the main surface of one of the protrusions overlaps with the side face perpendicular to the main surface of the other protrusion (e.g., see Japanese Unexamined Patent Publication No. 2013-197621 (Patent Document 1)).

Such crystal element is so structured that a part of the crystal piece sandwiched between the pair of excitation electrodes oscillates when an alternate voltage is applied to the metal pattern. In that case, the oscillation of the crystal piece sandwiched between the pair of excitation electrodes propagates from the outer edge of the excitation electrodes toward the outer edge of the crystal pieces in a plan view, i.e., in the direction toward the side face of the protrusion. When the oscillation propagates to the outer edge of the crystal piece, specifically to the side face of the protrusion, the oscillation is reflected at the side face of the protrusion. The conventional crystal element uses the crystal piece that includes the protrusion having the side face perpendicular to the main surface of the protrusion itself and the other protrusion having the side face perpendicular to the main surface of the other protrusion itself, and the excitation electrodes are provided on the both main surfaces of the crystal piece, i.e., on the main surface of the protrusion and the main surface of the other protrusion. Thus, the reflection amount of the oscillation propagated from a part of the crystal piece sandwiched between the pair of excitation electrodes becomes greater in the side face that is perpendicular to the main surface of the protrusion compared to that of the side face sloping with respect to the main surface of the protrusion. Therefore, the oscillation of a part of the crystal piece sandwiched between the excitation electrodes and the reflected oscillation are combined. As a result, the equivalent series resistance value becomes increased so that the electric characteristic may be deteriorated.

It is an exemplary object of the present invention to provide a crystal element and a crystal device capable of decreasing changes in the electric characteristics caused when the oscillation propagated from a part of the crystal piece sandwiched between the excitation electrodes is reflected at the side face of the protrusion.

SUMMARY OF THE INVENTION

In order to overcome the foregoing issue, the crystal element according to the present invention is a crystal element which includes: a crystal piece in a substantially rectangular shape in a plan view, which includes an oscillation section having a first protruded section and a second protruded section projected to mutually opposing directions and a peripheral section which is thinner than the oscillation section and provided along an outer edge of the oscillation section; a pair of excitation electrodes provided on a top surface of the first protruded section and on a bottom surface of the second protruded section; a pair of leading sections provided side by side along a prescribed side of the crystal piece; and a wiring section whose one end is connected to the excitation electrode and other end is connected to the leading section, wherein: the first protruded section includes a first side face that is sloping with respect to the top surface of the first protruded section where the excitation electrode is provided, and a second side face which is opposing to the first side face in a prescribed direction and opposing to the top surface of the first protruded section where the excitation electrode is provided; the second protruded section includes a third side face that is sloping with respect to the bottom surface of the second protruded section where the excitation electrode is provided, and a fourth side face which is opposing to the third side face in a prescribed direction and opposing to the bottom surface of the second protruded section where the excitation electrode is provided; the first side face is disposed to overlap with the third side face in a plan view of the crystal piece in a thickness direction; and the second side face is disposed to overlap with the fourth side face in the plan view of the crystal piece in the thickness direction.

The crystal element according to the present invention is a crystal element which includes: a crystal piece in a substantially rectangular shape in a plan view, which includes an oscillation section having a first protruded section and a second protruded section projected to mutually opposing directions and a peripheral section which is thinner than the oscillation section and provided along an outer edge of the oscillation section; a pair of excitation electrodes provided on a top surface of the first protruded section and on a bottom surface of the second protruded section; a pair of leading sections provided side by side along a prescribed side of the crystal piece; and a wiring section whose one end is connected to the excitation electrode and other end is connected to the leading section, wherein: the first protruded section includes a first side face that is sloping with respect to the top surface of the first protruded section where the excitation electrode is provided, and a second side face which is opposing to the first side face in a prescribed direction and opposing to the top surface of the first protruded section where the excitation electrode is provided; the second protruded section includes a third side face that is sloping with respect to the bottom surface of the second protruded section where the excitation electrode is provided, and a fourth side face which is opposing to the third side face in a prescribed direction and opposing to the bottom surface of the second protruded section where the excitation electrode is provided; the first side face is disposed to overlap with the third side face in a plan view of the crystal piece in a thickness direction; and the second side face is disposed to overlap with the fourth side face in the plan view of the crystal piece in the thickness direction. Thus, the first side face and the second side face are sloping with respect to the top surface of the first protruded section, while the third side face and the fourth side face are sloping with respect to the bottom surface of the second protruded section. Therefore, the crystal element according to the present invention is capable of decreasing the amount of the oscillation propagated from the part sandwiched between the excitation electrodes and reflected at the first side face, the second side face, the third side face, and the fourth side face compared to the case where the first side face or the second side face is perpendicular to the top surface of the first protruded section and the case where the third side face or the fourth side face is perpendicular to the bottom surface of the second protruded section. As a result, the deterioration amount of the electric characteristic caused by the oscillation reflected at the first side face, the second side face, the third side face, and the fourth side face can be suppressed.

DETAILED DESCRIPTIONS OF THE PREFERRED EXEMPLARY EMBODIMENTS

Figure 1:
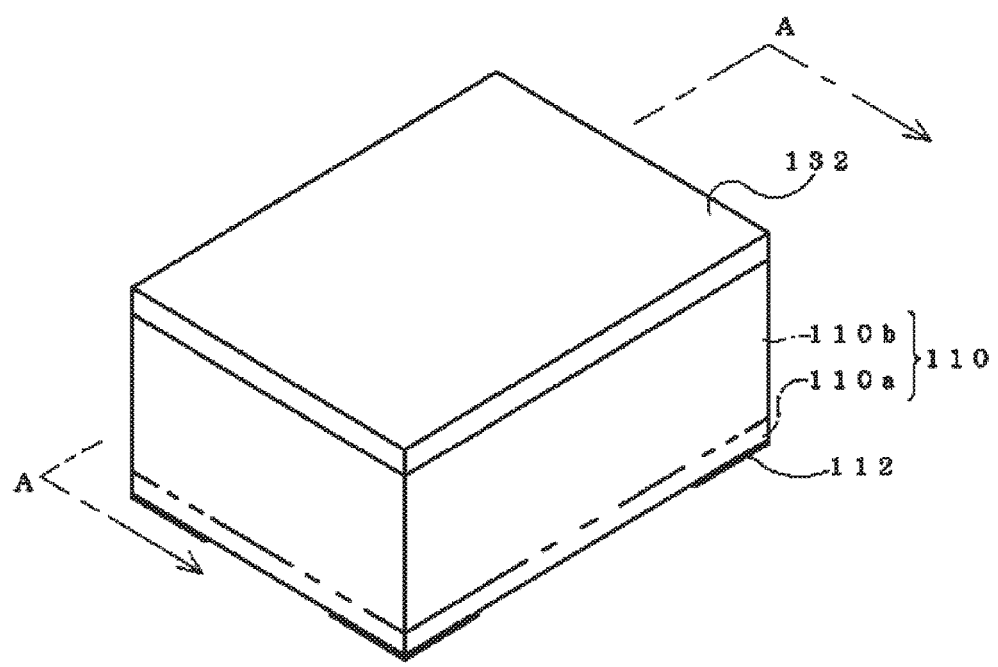
FIG. 1 is a perspective view of a crystal device according to an exemplary embodiment.
Figure 2:
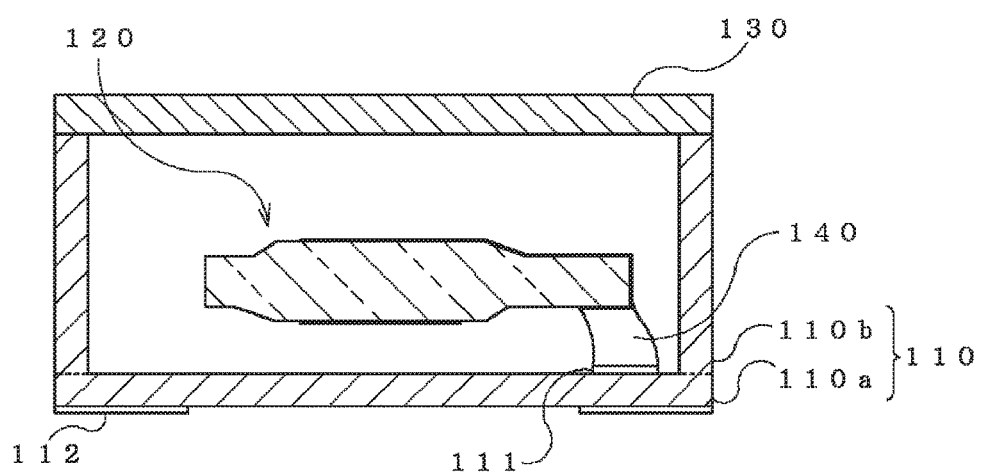
FIG. 2 is a sectional view taken along a line A-A of FIG. 1.
Figure 3A:
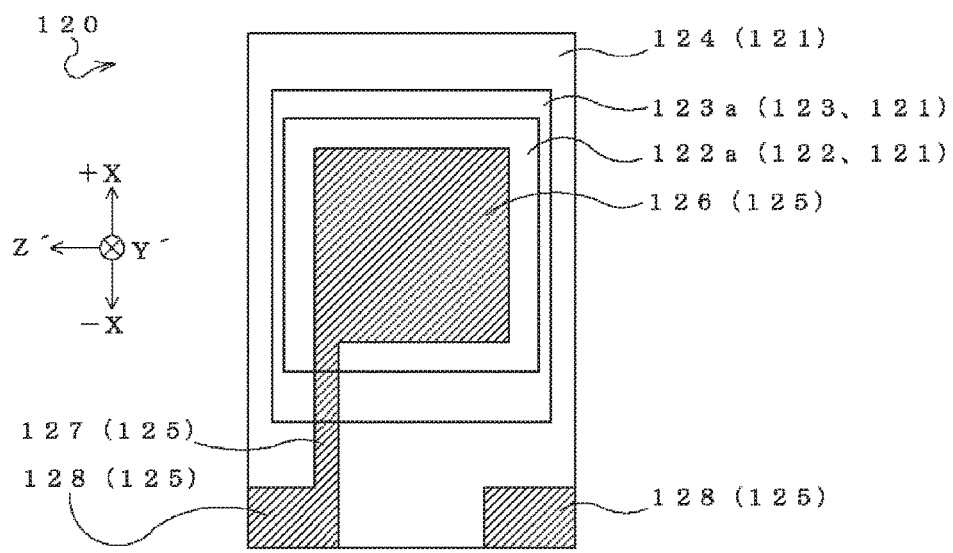
FIG. 3A is a plan view of the top surface of a crystal element according to the exemplary embodiment.
Figure 3B:
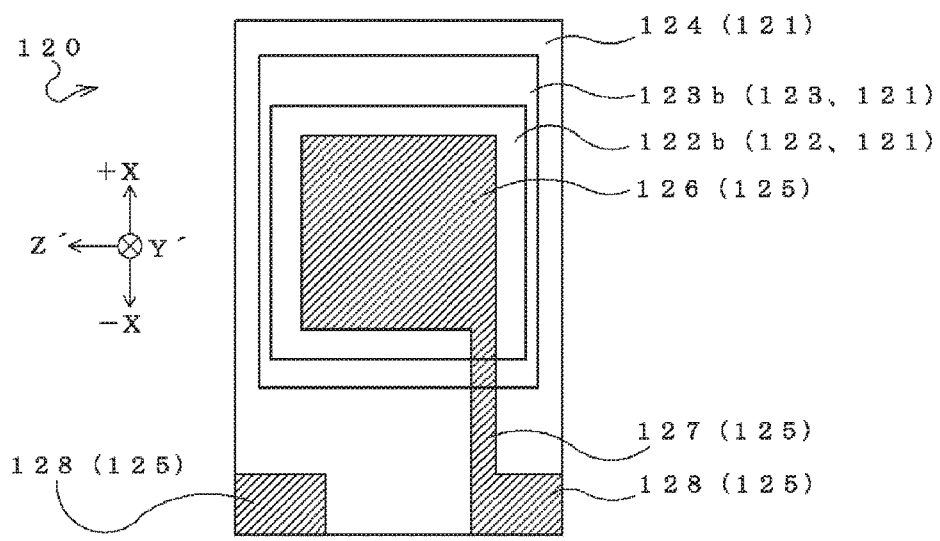
FIG. 3B is a perspective plan view of the bottom surface of the crystal element according to the exemplary embodiment viewed from the top surface.
Figure 4A:
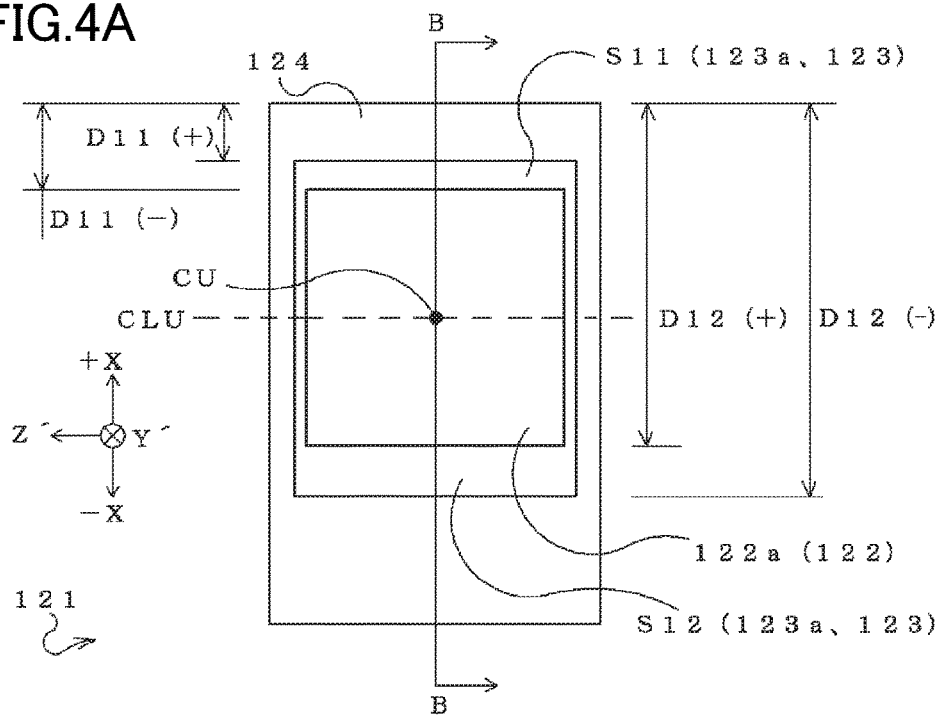
FIG. 4A is a plan view of the top surface of a crystal piece.
Figure 4B:
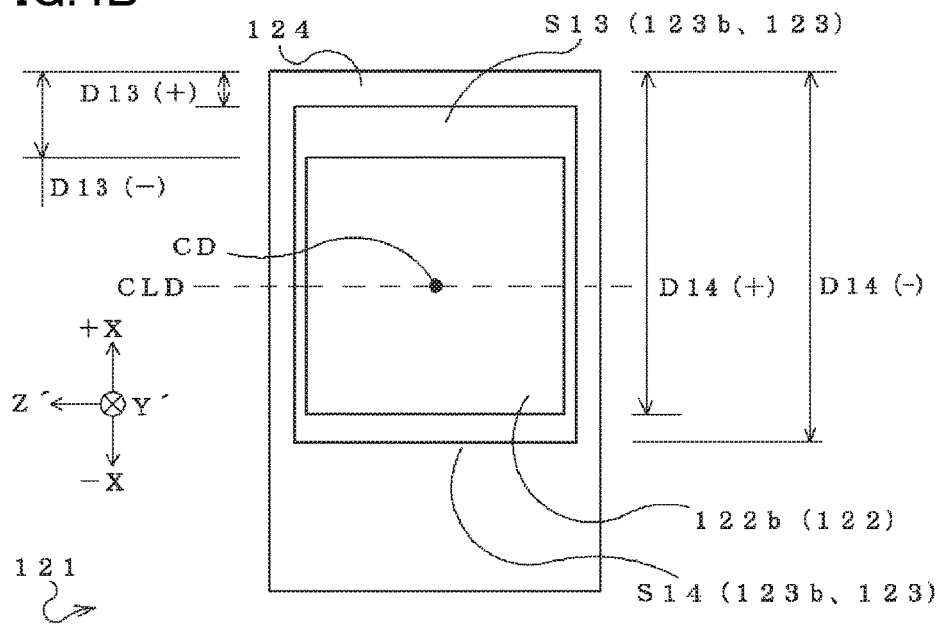
FIG. 4B is a perspective plan view of the bottom surface of the crystal piece viewed from the top surface.
Figure 5:
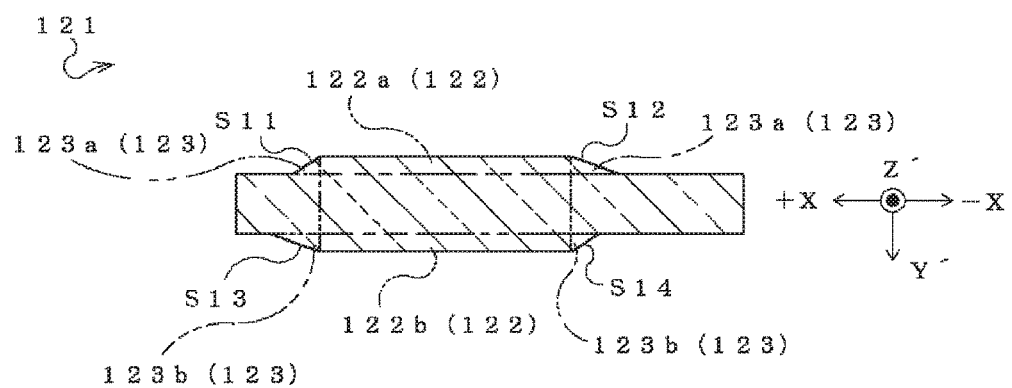
FIG. 5 is a sectional view taken along a line B-B of FIG. 4A for describing the angles between the main surfaces and side faces of protrusions.
Figure 6:
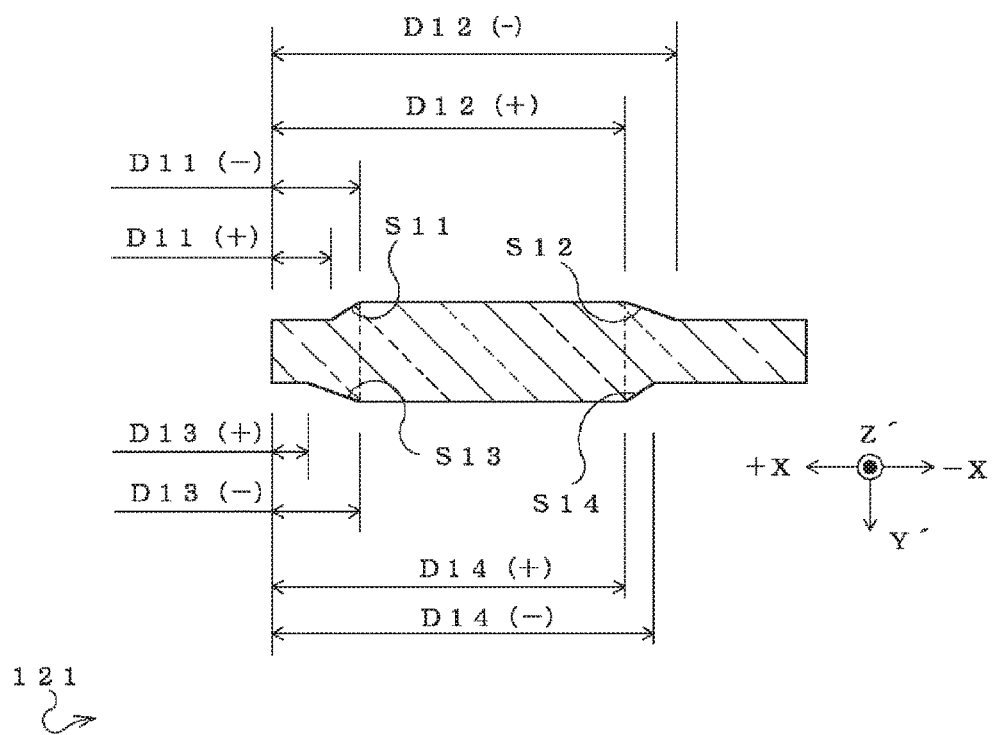
FIG. 6 is a sectional view taken along the line B-B of FIG. 4A for describing the distance from a prescribed other side of the crystal piece to the side faces.

FIG. 1 is a perspective view of a crystal device according to an exemplary embodiment, and FIG. 2 is a sectional view taken along a line A-A of FIG. 1. FIG. 3A and FIG. 3B are plan views of a crystal element 120 according to the exemplary embodiment. FIG. 4A and FIG. 4B are plan views of a crystal piece 121. FIG. 5 and FIG. 6 are sectional views of the crystal piece 121 taken along a line B-B.

(Schematic Structure of Crystal Device)

The crystal device is an electronic component that is in a substantially cuboid shape as a whole, for example. The length of the long side or the short side of the crystal device is 0.6 mm to 2.0 mm, and the thickness thereof in the vertical directions is 0.2 mm to 1.5 mm.

For example, the crystal device is configured with: an element loading member 110 where a recessed section is formed; a crystal element 120 housed inside the recessed section; a lid 130 for covering the recessed section; and a conductive adhesive 140 for adhesively mounting the crystal element 120 to the element loading member 110.

The recessed section of the element loading member 110 is sealed by the lid 130, and the inside thereof is in a vacuum, for example, or an appropriate gas (e.g., nitrogen) is enclosed therein.

For example, the element loading member 110 is configured with: a base unit 110a to be the main body of the element loading member 110; a frame unit 110b provided along the edge of the top surface of the base unit 110a; a loading pad 111 for mounting the crystal element 120; and an external terminal 112 for mounting the crystal device to a circuit board and the like, not shown. The frame-shaped frame unit 110b is provided to the element loading member 110 along the edge of the top surface of the base unit 110a, thereby forming the recessed section.

The base unit 110a and the frame unit 110b are formed with an insulating material such as a ceramic material. The loading pad 111 and the external terminal 112 are formed with a conductive layer made of metal or the like, for example, and are electrically connected to each other via a conductor (not shown) disposed inside the base unit 110a. The lid 130 is formed with metal, for example, and joined to the element loading member 110, specifically to the top surface of the frame unit 110b by seam welding or the like.

The crystal element 120 includes, for example: a pair of excitation electrodes 126 for applying a voltage to the crystal piece 121; and a pair of wiring sections 127 for mounting the crystal element 120 to the loading pad 111.

The crystal piece 121 is the so-called AT-cut crystal piece. That is, it is a plate cut out in parallel to the XZ' plane when the Cartesian coordinates XYZ formed with the X-axis (electrical axis), the Y-axis (mechanical axis), and the Z-axis (optical axis) in a crystal is rotated about the X-axis at an angle in a range of 30° to 50°, both inclusive, (35° 15', for example) to define the Cartesian coordinates system XY'Z'.

The pair of excitation electrodes 126 and the pair of wiring sections 127 are formed with a conductor made of metal. The pair of excitation electrodes 126 is provided on the center side of the both main surfaces of the crystal piece 121, for example. The pair of wiring sections 127 are extended from the excitation electrodes 126 toward the one side of the X-axis direction (e.g., −X direction side), and include a pair of leading sections 128 along the end part of a prescribed side of the crystal piece 121.

The crystal element 120 is housed inside the recessed section of the element loading member 110 by having the main surface thereof facing the top surface of the base unit 110a of the element loading member 110. The leading sections 128 are adhesively fixed to the loading pad 111 provided to the base unit 110a of the element loading member 110 via the conductive adhesive 140. Thereby, the crystal element 120 is supported by the element loading member 110 like cantilever beam. Further, the pair of excitation electrodes 126 are electrically connected to a pair of loading pads 111 of the element loading member 110 and electrically connected to two external terminals out of a plurality of external terminals 112 of the element loading member 110 consequently.

The crystal device structured in this manner is disposed by having the bottom face of the element loading member opposed to the mounting face of the circuit board, not shown, for example, and mounted to the circuit board through joining the external terminals 112 to the pad of the circuit board by soldering or the like. For example, an oscillation circuit is structured on the circuit board. The oscillation circuit generates oscillation signals by applying alternate voltages to the pair of excitation electrodes 126 via the external terminals 112 and the loading pads 111. At this time, the oscillation circuit utilizes a basic wave vibration among the thickness slip vibration of the crystal piece 121, for example.

(Shape of Crystal Element)

FIG. 3A is a plan view of the top surface of the crystal element 120 viewed two-dimensionally, and FIG. 3B is a perspective plan view of the bottom surface of the crystal element 120 viewed from the top surface. Further, FIG. 4A is a plan view of the top surface of the crystal piece viewed two-dimensionally, and FIG. 4B is a perspective plan view of the bottom surface of the crystal piece 121 viewed from the top surface. FIG. 5 and FIG. 6 are sectional views taken along a line B-B.

The exemplary embodiment is described assuming that the face substantially in parallel to the top surface of the base unit 110a of the element loading member 110 is the main surface when the crystal element 120 is mounted to the element loading member 110, the direction from the crystal element 120 toward the base unit 110a of the element loading member 110 is the downward direction, and the direction from the base unit 110a of the element loading member 110 toward the crystal element 120 is the upward direction.

The surface of the crystal element 120 facing toward the base unit 110a of the element loading member 110a is defined as the bottom face of the crystal element 120, the surface of the crystal element 120 facing toward the opposite side of the bottom face of the crystal element 120 is defined as the top surface of the crystal element 120, and the top surface of the crystal element 120 and the bottom surface of the crystal element 120 are defined as the main surfaces of the crystal element 120. Similarly, the surface of the crystal piece 121 facing toward the base unit 110a of the element loading member 110 is defined as the bottom face of the crystal piece 121, the surface of the crystal piece 121 facing toward the opposite side of the bottom face of the crystal piece 121 is defined as the top surface of the crystal piece 121, and the top surface of the crystal piece 121 and the bottom surface of the crystal piece 121 are defined as the main surfaces of the crystal piece 121. Similarly, the surface of the oscillation section 122 facing toward the base unit 110a of the element loading member 110 is defined as the bottom face of the oscillation section 122, the surface of the oscillation section 122 facing toward the opposite side of the bottom face of the oscillation section 122 is defined as the top surface of the oscillation section 122, and the top surface of the oscillation section 122 and the bottom surface of the oscillation section 122 are defined as the main surfaces of the oscillation section 122.

Further, the protrusion provided to the oscillation section 122 and projected toward the opposite side of the base unit 110a of the element loading member 110 is defined as a first protruded section 122a, and the protrusion projected toward the base unit 110a side of the element loading member 110 is defined as a second protruded section 122b. In this case, the surface of the first protruded section 122a substantially in parallel to the top surface of the base unit 110a of the element loading member 110 is defined as the main surface of the first protruded section 122a, and the surface of the second protruded section 122b substantially in parallel to the top surface of the base unit 110a of the element loading member 110 is defined as the main surface of the second protruded section 122b.

Note that the top surface of the oscillation section 122 and the main surface of the first protruded section 122a are used as the same meaning, and the top surface of the crystal element 120 and the top surface of the crystal piece 121 are used as the same meaning. Further, the top surface of the crystal element 120, the top surface of the crystal piece 121, the top surface of the oscillation section 122, and the main surface of the first protruded section 122a are located on a same plane. Meanwhile, the bottom surface of the oscillation section 122 and the main surface of the second protruded section 122b are used as the same meaning, and the bottom surface of the crystal element 120 and the bottom surface of the crystal piece 121 are used as the same meaning. Further, the bottom surface of the crystal element 120, the bottom surface of the crystal piece 121, the bottom surface of the oscillation section 122, and the main surface of the second protruded section 122b are located on a same plane.

The crystal element 120 is configured with: the crystal piece 121 including the first protruded section 122a and the second protruded section 122b; the excitation electrodes 126; and the metal pattern 125 constituted with the wiring sections 127 and the leading sections 128.

The crystal piece 121 is the so-called mesa type, which is configured with the oscillation section including the first protruded section 122a and the second protruded section 122b projected toward the directions opposing to each other, sloping sections 123, and a peripheral section 124. Such shape makes it possible to improve the energy enclosing effect compared to a case of using a plate-type crystal piece and the equivalent series resistance value can be made smaller as a result. The shape of the crystal piece 121 in a plan view is a substantially rectangular shape. The main surface thereof is a rectangular including the long sides that are in parallel to the X-axis and the short sides that are in parallel to the Z'-axis. In such crystal piece 121, the X-axis direction is defined as the longitudinal direction.

The oscillation section 122 is a thin-type cuboid having a pair of main surfaces in parallel to the XZ' plane, for example, and the main surfaces thereof are rectangles having the long sides in parallel to the X-axis and short sides in parallel to the Z'-axis. A pair of excitation electrodes 126 is provided to the both main surfaces (the main surface of the first protruded section 122a and the main surface of the second protruded section 122b) of the oscillation section 122. When an alternate voltage is applied to the pair of excitation electrodes 126, a part of the oscillation section 122 sandwiched between the excitation electrodes 126 can be thickness-slip-vibrated due to an inverted piezoelectric effect or a piezoelectric effect. At this time, the thickness slip vibration is propagated from the part sandwiched between the excitation electrodes 126 also to the outer edge side of the oscillation section 122 that is not sandwiched between the excitation electrodes 126.

As described above, in the exemplary embodiment, the protrusion provided to the oscillation section 122 and projected toward the opposite side of the base unit 110a of the element loading member 110 is defined as the first protruded section 122a, and the protrusion projected toward the base unit 110a side of the element loading member 110 is defined as the second protruded section 122b.

The first protruded section 122a is the protrusion projected upward. As shown in FIG. 3A, the first protruded section 122a is in a rectangular shape having the long sides that are in parallel to the X-axis and the short sides that are in parallel to the Z'-axis in a plan view of the top surface of the crystal piece 121. Further, the sloping section 123 (the first slope 123a) is provided along the outer edge of the first protruded section 122a.

The second protruded section 122b is the protrusion projected downward. As shown in FIG. 3B, the second protruded section 122b is in a rectangular shape having the long sides that are in parallel to the X-axis and the short sides that are in parallel to the Z'-axis in a perspective plan view of the bottom surface of the crystal piece 121 viewed from the top surface. Also, the main surface of the second protruded section 122b is in parallel to the main surface of the first protruded section 122a as shown in FIGS.A 4A and 4B. Further, the sloping section 123 (the second slope 123b) is provided along the outer edge of the second protruded section 122b.

The sloping section 123 includes the first slope 123a and the second slope 123b. The thickness in the vertical direction of the sloping section 123 becomes gradually thinner from the oscillation section 122 toward the direction of the peripheral unit 124 in a sectional view of the crystal piece 121 as shown in FIG. 5 and FIG. 6. The first slope 123a is a part of the sloping section 123 provided along the outer edge of the first protruded section 122a. The second slope 123b is a part of the sloping section 123 provided along the outer edge of the second protruded section 122b.

Here, as shown in FIG. 5, the side face that is the first slope 123a (the sloping section 123 provided along the first protruded section 122a) and located in the +X-axis direction is defined as a first side face S11 in a sectional view of the crystal piece 121 taken along the XY' plane (the face in parallel to the X-axis and the Y'-axis), and the side face that is the first slope 123a and located in −X-axis direction is defined as a second side face S12. Further, as shown in FIG. 4A and FIG. 5, the side face that is the second slope 123b (the sloping section 123 provided along the second protruded section 122b) and located in the +X-axis direction is defined as a third side face S13 in a sectional view of the crystal piece 121 taken along the XY' plane, and the side face that is the second slope 123b and located in −X-axis direction is defined as a fourth side face S14.

As shown in FIG. 5, the first side face S11 is a surface located on the +X-axis side among the surfaces of the slope 123a in parallel to the Z'-axis in a plan view of the top surface of the crystal piece 121. That is; the first side face S11 is located on the positive direction side of the X-axis with respect to a virtual line CLU that is perpendicular to the X-axis passing through the center CU of the main surface (the top surface of the oscillation section 122) of the first protruded section 122a. The angle between the first side face S11 and the main surface of the first protruded section 122a is an obtuse angle (an angle larger than 90° and smaller than 180°). Specifically, it is 135° to 155°.

As shown in FIG. 5, the second side face S12 is a surface located on the −X-axis side among the surfaces of the slope 123a in parallel to the Z'-axis in a plan view of the top surface of the crystal piece 121. That is, the second side face S12 is located on the negative direction side of the X-axis with respect to the virtual line CLU that is perpendicular to the X-axis passing through the center CU of the main surface (the top surface of the oscillation section 122) of the first protruded section 122a. The angle between the second side face S12 and the main surface of the first protruded section 122a is an obtuse angle (an angle larger than 90° and smaller than 180°). Specifically, it is 150° to 170°.

As shown in FIG. 5, the third side face S13 is a surface located on the +X-axis side among the surfaces of the second slope 123b in parallel to the Z'-axis in a perspective plan view of the bottom surface of the crystal piece 121 viewed from the top surface thereof. That is, the third side face S13 is located on the positive direction side of the X-axis with respect to the virtual line CLU that is perpendicular to the X-axis passing through the center CU of the main surface (the bottom surface of the oscillation section 122) of the second protruded section 122b. The angle between the third side face S13 and the main surface of the second protruded section 122b is an obtuse angle (an angle larger than 90° and smaller than 180°). Specifically, it is 150° to 170°. Further, as shown in FIG. 5 and FIG. 6, in the sectional view of the crystal piece 121 taken along the XY' plane (the surface in parallel to the X-axis and the Y'-axis), the third side face S13 is located at the position overlapping with the first side face S11 vertically.

As shown in FIG. 5, the fourth side face S14 is a surface located on the −X-axis side among the surfaces of the second slope 123b in parallel to the Z'-axis in a perspective plan view of the bottom surface of the crystal piece 121 viewed from the top surface thereof. That is, the fourth side face S14 is located on the negative direction side of the X-axis with respect to the virtual line CLU that is perpendicular to the X-axis passing through the center CU of the main surface (the bottom surface of the oscillation section 122) of the second protruded section 122b. The angle between the fourth side face S14 and the main surface of the second protruded section 122b is an obtuse angle (an angle larger than 90° and smaller than 180°). Specifically, it is 135° to 155°. Further, as shown in FIG. 5 and FIG. 6, in the sectional view of the crystal piece 121 taken along the XY' plane (the surface in parallel to the X-axis and the Y'-axis), the fourth side face S14 is located at the position overlapping with the second side face S12 vertically.

Therefore, as shown in FIG. 5 and FIG. 6, in the sectional view of the crystal piece 121, the first side face S11 and the third side face S13 are located in the vertical direction while the second side dace S12 and the fourth side face S14 are located in the vertical direction. From another view point, in the perspective plan view of the crystal piece 121, the first side face S11 and the third side face 13 overlap with each other while the second side face S12 and the fourth side face S14 overlap with each other. With such structure, in a case where oscillation is propagated from the part sandwiched between the excitation electrodes 126 toward the direction from the outer edge of the excitation electrodes 126 to the outer edge of the oscillation section 122 in the plan view of the crystal element 120, the angle between the propagating direction and the side face (the first side face S11, the second side face S12, the third side face S13, or the fourth side face S14) can be made smaller compared to the case where the side face (the first side face S11, the second side face S12, the third side face S13, or the fourth side face S14) is perpendicular. Therefore, the amount reflected at the first side face S11, the second side face S12, the third side face S13, and the fourth side face S14 can be decreased, so that the deterioration amount of the electric characteristic caused by the oscillation reflected at the first side face S11, the second side face S12, the third side face S13, and the fourth side face S14 can be suppressed.

Further, in the crystal piece 121, the first side face S11 and the third side face S13 are located in the vertical direction while the second side dace S12 and the fourth side face S14 are located in the vertical direction in the sectional view taken along the XY' plane (the surface in parallel to the X-axis and the Y'-axis). That is, in the plan view of the crystal piece 121, the first side face S11 is located on the positive direction side of the X-axis with respect to the virtual line CLU which passes the center CU of the main surface of the first protruded section 122a and is perpendicular to the X-axis, the second side face S12 is located on the negative direction side of the X-axis with respect to the virtual line CLU which passes the center CU of the main surface of the first protruded section 122a and is perpendicular to the X-axis, the third side face S13 is located on the positive direction side of the X-axis with respect to the virtual line CLU which passes the center CU of the main surface of the second protruded section 122b and is perpendicular to the X-axis, and the fourth side face S14 is located on the negative direction side of the X-axis with respect to the virtual line CLU which passes the center CU of the main surface of the second protruded section 122b and is perpendicular to the X-axis. With this, oscillation reflected at the side face (the first side face S11, the second side face S12, the third side face S13, or the fourth side face S14) can be decreased, so that the influence imposed upon the thickness slip vibration of the part sandwiched between the excitation electrodes 126 can be suppressed. Therefore, the deterioration amount of the electric characteristic can be suppressed. In general, when a voltage is applied to the excitation electrodes 126 and a part of the oscillation section 122 sandwiched between the excitation electrodes 126 is thickness-slip-vibrated, the vibration displacement becomes the greatest in the center part in the direction in parallel to the X-axis. Thus, the oscillation reflected and propagated from the side face in a direction in parallel to the X-axis tends to influence the thickness slip vibration of the part sandwiched between the excitation electrodes 126. That is, the exemplary embodiment is designed to locate the first side face S11 and the third side face S13 in the vertical direction and locate the second side dace S12 and the fourth side face S14 in the vertical direction in the sectional view taken along the XY' plane (the surface in parallel to the X-axis and the Y'-axis) so that the oscillation reflected at the side face (the first side face S11, the second side face S12, the third side face S13, or the fourth side face S14) can be more decreased compared to the case where those are located in the vertical direction in the sectional view of the Z'Y' plane. Thus makes it possible to decrease the influence imposed upon the thickness slip vibration of the part sandwiched between the excitation electrodes 126, so that the deterioration amount of the electric characteristic can be suppressed.

Further, in the crystal piece 121 of the exemplary embodiment, the angle between the main surface of the first protruded section 122a and the first side face S11 is an obtuse angle (an angle larger than 90° and smaller than 180°) in the sectional view taken along the XY' plane (the surface in parallel to the X-axis and the Y'-axis), the angle between the main surface of the first protruded section 122a and the second side face S12 is an obtuse angle, the angle between the main surface of the second protruded section 122b and the third side face S13 is an obtuse angle, and the angle between the main surface of the second protruded section 122b and the fourth side face S14 is an obtuse angle. With such structure, in a case where oscillation is propagated from the part sandwiched between the excitation electrodes 126 toward the direction from the outer edge of the excitation electrodes 126 to the outer edge of the oscillation section 122 in the plan view of the crystal element 120, the angle between the propagating direction and the side face (the first side face S11, the second side face S12, the third side face S13, or the fourth side face S14) can be made still smaller compared to the case where the side face (the first side face S11, the second side face S12, the third side face S13, or the fourth side face S14) is perpendicular. Therefore, the amount reflected at the first side face S11, the second side face S12, the third side face S13, and the fourth side face S14 can be decreased, so that the deterioration amount of the electric characteristic caused by the oscillation reflected at the first side face S11, the second side face S12, the third side face S13, and the fourth side face S14 can be suppressed further.

Specifically, in the crystal piece 121 of the exemplary embodiment, the angle between the main surface of the first protruded section 122a and the first side face S11 is 135° to 155°, the angle between the main surface of the first protruded section 122a and the second side face S12 is 150° to 170°, the angle between the main surface of the second protruded section 122b and the third side face S13 is 150° to 170°, and the angle between the main surface of the second protruded section 122b and the fourth side face S14 is 135° to 155°. With such structure, when a voltage is applied to the excitation electrodes 126 and a part of the oscillation section 122 sandwiched between the excitation electrodes 126 is thickness-slip-vibrated, the amount of oscillation reflected at the side face (the first side face S11, the second side face S12, the third side face S13, or the fourth side face S14) to the direction in parallel to the X-axis can be more decreased, so that the deterioration amount of the electric characteristic can be suppressed further. Especially, the angles with respect to the side faces and the way of propagation of the thickness slip vibration are determined according to the cut angles of the crystal wafer, so that the deterioration amount of the electric characteristic is suppressed by determining the angles with respect to the side faces in this manner in the exemplary embodiment. Note that the tolerance of the angles is within ±3°.

In the plan view of the crystal piece 121, the peripheral section 124 is provided along the outer edge of the sloping unit 123. The thickness of the peripheral section 124 in the vertical direction is thinner than the thickness of the oscillation section 122 in the vertical direction (the distance from the main surface of the first protruded section 122a to the main surface of the second protruded section 122b).

As shown in FIG. 4A, in the plan view of the top surface of the crystal piece 121, distance D11 (+) from a prescribed other side of the crystal piece 121 (the side opposing to a prescribed side of the crystal piece 121 where the leading sections 128 are provided side by side) to the first side face S11 located on the positive direction side of the X-axis is shorter than distance D11 (−) from the prescribed other side of the crystal piece 121 to the first side face S11 located on the negative direction side of the X-axis. Further, distance D12 (+) from a prescribed other side of the crystal piece 121 to the second side face S12 located on the positive direction side of the X-axis is shorter than distance D12 (−) from the prescribed other side of the crystal piece 121 to the second side face S12 located on the negative direction side of the X-axis.

As shown in FIG. 4B, in the perspective plan view of the bottom surface of the crystal piece 121 viewed through the top surface, distance D13 (+) from a prescribed other side of the crystal piece 121 to the third side face S13 located on the positive direction side of the X-axis is shorter than distance D13 (−) from the prescribed other side of the crystal piece 121 to the third side face S13 located on the negative direction side of the X-axis. Further, distance D14 (+) from a prescribed other side of the crystal piece 121 to the fourth side face S14 located on the positive direction side of the X-axis is shorter than distance D14 (−) from the prescribed other side of the crystal piece 121 to the fourth side face S14 located on the negative direction side of the X-axis.

As shown in FIG. 4B and FIG. 6, the distance D13 (+) from the prescribed other side of the crystal piece 121 to the third side face S13 located on the positive direction side of the X-axis is shorter than the distance D11 (−) from the prescribed other side of the crystal piece 121 to the first side face S11 located on the negative direction side of the X-axis. Further, as shown in FIG. 4B and FIG. 6, the distance D14 (+) from the prescribed other side of the crystal piece 121 to the fourth side face S14 located on the positive direction side of the X-axis is shorter than the distance D12 (−) from the prescribed other side of the crystal piece 121 to the second side face S12 located on the negative direction side of the X-axis. That is, in the crystal piece 121, assuming that the side perpendicular to the X-axis located on the positive direction side of the X-axis with respect to the virtual lines CLU and CLD is the prescribed other side of the crystal piece 121, the distance (D13 (+)) from the prescribed other side to the side of the third side face S13 close to the prescribed other side is shorter than the distance (D11 (−)) from the prescribed other side to the side of the first side face S11 distant from the prescribed other side, and the distance (D14 (+)) from the prescribed other side to the side of the fourth side face S14 close to the prescribed other side is shorter than the distance (D12 (−)) from the prescribed other side to the side of the second side face S12 distant from the prescribed other side This makes it possible to locate the first side face S11 and the third side face S13 in the vertical direction while locating the second side face S12 and the fourth side face S14 in the vertical direction in the sectional view of the crystal piece 121. From another view point, in the perspective plan view of the crystal piece 121, the first side face S11 and the third side face 13 can overlap with each other while the second side face S12 and the fourth side face S14 overlap with each other. That is, in a case where oscillation is propagated from the part sandwiched between the excitation electrodes 126 toward the direction from the outer edge of the excitation electrodes 126 to the outer edge of the oscillation section 122 in the plan view of the crystal element 120, the angle between the propagating direction and the side face (the first side face S11, the second side face S12, the third side face S13, or the fourth side face S14) can be made smaller compared to the case where the side face (the first side face S11, the second side face S12, the third side face S13, or the fourth side face S14) is perpendicular. Therefore, the amount reflected at the first side face S11, the second side face S12, the third side face S13, and the fourth side face S14 can be decreased, so that the deterioration amount of the electric characteristic caused by the oscillation reflected at the first side face S11, the second side face S12, the third side face S13, and the fourth side face S14 can be suppressed.

In the crystal piece 121, the distance D11 (−) from the prescribed other side of the crystal piece 121 to the first side face S11 located on the negative direction side of the X-axis and the distance D13 (−) from the prescribed other side of the crystal piece 121 to the third side face S13 located on the negative direction side of the X-axis are equivalent. That is, in the crystal piece 121, the distance (D11 (−)) from the prescribed other side to the side of the first side face S11 distant from the prescribed other side is equivalent to the distance (D13 (−)) from the prescribed other side to the side of the third side face S13 distant from the prescribed other side, and the distance (D14 (+)) from the prescribed other side to the side of the fourth side face S14 close to the prescribed other side is equivalent to the distance (D12 (+)) from the prescribed other side to the side of the second side face S12 close to the prescribed other side. Further, in the crystal piece 121, the distance D12 (+) from the prescribed other side of the crystal piece 121 to the second side face S12 located on the positive direction side of the X-axis and the distance D14 (+) from the prescribed other side of the crystal piece 121 to the fourth side face S14 located on the positive direction side of the X-axis are equivalent. With such structure, in the perspective plan view of the crystal piece 120, the first side face S11 located on the negative direction side of the X-axis and the third side face 13 located on the negative direction side of the X-axis can overlap with each other while the second side face S12 located on the positive direction side of the X-axis and the fourth side face S14 located on the positive direction side of the X-axis can overlap with each other. Therefore, the amount reflected at the first side face S11, the second side face S12, the third side face S13, and the fourth side face S14 can be decreased. As a result, the deterioration amount of the electric characteristic caused by the oscillation reflected at the first side face S11, the second side face S12, the third side face S13, and the fourth side face S14 can be suppressed.

Now, a method for forming such crystal piece 121 will be described. The forming method of such crystal piece 121 is constituted with a crystal wafer preparing step, a first etching step, and a second etching step, for example. In the crystal wafer preparing step, first, a crystal wafer having crystalline axes constituted with mutually orthogonal X-axis, Y-axis, and Z-axis is prepared. At this time, the thickness of the crystal wafer in the vertical direction is equivalent to the thickness of the oscillation section 122 in the vertical direction. Further, the cut angle of the main surface of the crystal wafer is equivalent to that of the main surface of the oscillation section 122. Thus, the main surface of the crystal wafer is in parallel to the surface that is acquired by rotating the surface in parallel to the X-axis and the Z-axis about the X-axis at a prescribed angle counterclockwise to the negative direction of the X-axis. In the first etching step, a photolithography technique and an etching technique are used. First, a protection metal film is provided on the both main surfaces of the crystal wafer, a photosensitive resist is applied on the protection metal film, and it is exposed and developed to a prescribed pattern. At this time, in a plan view of the crystal wafer, the photosensitive resist remains in the part to be the oscillation section 122, while no photosensitive resist remains in the part to be the sloping section 123 and the peripheral section 124. Thereafter, the crystal wafer is soaked in a prescribed etching solution to be etched until the thickness of the etched crystal wafer in the vertical direction reaches the thickness of the peripheral section 124 in the vertical direction. At this time, the sloping section 123 is also formed by anisotropic etching that is peculiarly used for crystal. At last, the photosensitive resist and the protection metal film remained in the crystal wafer are exfoliated. In the second etching step, a protection metal film is provided on the both main surfaces of the crystal wafer that has gone through the first etching step, a photosensitive resist is applied on the protection metal film, and it is exposed and developed to a prescribed pattern. At this time, in a plan view of the crystal wafer, the photosensitive resist remains in the part to be the crystal piece 121. Thereafter, the crystal wafer is soaked in an etching solution to be etched. In the manner described above, a plurality of crystal pieces 121 with a part thereof being connected can be formed within the crystal wafer. As described above, the angles between the main surface of the protrusion and the side faces are determined according to the cut angles of the crystal wafer. For example, through using an AT-cut plate cut out in parallel to the XZ' plane by rotating the crystal within a range of 30° to 50°, both inclusive, about the X-axis, it becomes possible to make the angle between the main surface of the first protruded section 122a and the first side face S11 as 135° to 155°, the angle between the main surface of the first protruded section 122a and the second side face S12 as 150° to 170°, the angle between the main surface of the second protruded section 122b and the third side face S13 as 150° to 170°, and the angle between the main surface of the second protruded section 122b and the fourth side face S14 as 135° to 155°. Further, through using an AT-cut plate cut out in parallel to the XZ' plane by rotating the crystal within a range of 35° 15' about the X-axis, it becomes possible to make the angle between the main surface of the first protruded section 122a and the first side face S11 as 147°, the angle between the main surface of the first protruded section 122a and the second side face S12 as 160°, the angle between the main surface of the second protruded section 122b and the third side face S13 as 160°, and the angle between the main surface of the second protruded section 122b and the fourth side face S14 as 147°.

Next, examples of each size of the crystal piece 121 will be described. The crystal piece 121 in a plan view is in a substantially rectangular shape, and the size of the long sides is 0.4 mm to 1.0 mm and the size of the short sides is 0.3 mm to 0.7 mm. The main surface of the first protruded section 122a is in a substantially rectangular shape, and the size thereof in parallel to the long side of the crystal piece 121 is 0.2 mm to 0.8 mm while the size thereof in parallel to the short side of the crystal piece 121 is 0.2 mm to 0.6 mm. The main surface of the second protruded section 122b is in a substantially rectangular shape, and the size thereof in parallel to the long side of the crystal piece 121 is 0.2 mm to 0.8 mm while the size thereof in parallel to the short side of the crystal piece 121 is 0.2 mm to 0.6 mm. The distance (the thickness of the oscillation section 122 in the vertical direction) from the main surface of the first protruded section 122a to the second protruded section 122b is 30 μm to 70 μm. Further, the thickness of the peripheral section 124 in the vertical direction is 10 μm to 65 μm.

The distance D11 (+) from the prescribed other side of the crystal piece 121 to the first side face S11 located on the positive direction side of the X-axis is 2 μm to 199 μm, and the distance D11 (−) from the prescribed other side of the crystal piece 121 to the first side face S11 located on the negative direction side of the X-axis is 30 μm to 200 μm. The distance D12 (+) from the prescribed other side of the crystal piece 121 to the second side face S12 located on the positive direction side of the X-axis is 230 μm to 900 μm, and the distance D12 (−) from the prescribed other side of the crystal piece 121 to the second side face S12 located on the negative direction side of the X-axis is 231 μm to 952 μm. The distance D13 (+) from the prescribed other side of the crystal piece 121 to the third side face S13 located on the positive direction side of the X-axis is 2 μm to 199 μm, and the distance D13 (−) from the prescribed other side of the crystal piece 121 to the third side face S13 located on the negative direction side of the X-axis is 30 μm to 200 μm. The distance D14 (+) from the prescribed other side of the crystal piece 121 to the fourth side face S14 located on the positive direction side of the X-axis is 230 μm to 900 μm, and the distance D14 (−) from the prescribed other side of the crystal piece 121 to the fourth side face S14 located on the negative direction side of the X-axis is 231 μm to 965 μm.

The metal pattern 125 provided to such crystal piece 121 is for applying a voltage from the outside of the crystal element 120. The metal pattern 125 may be of a single layer or may be constituted with a plurality of stacked metal layers. Although not shown, the metal pattern 125 is formed with a first metal layer and a second metal layer stacked on the first metal layer, for example. A metal that can be closely stuck to the crystal is used for the first metal layer. For example, one selected from nickel, chrome, and titanium can be used. The use of the metal that is closely stuck to the crystal makes it possible to use a metal material that is hardly stuck to the crystal for the second metal layer. For example, one selected from gold, an alloy containing gold, silver, and an alloy containing silver can be used for the second metal layer. As described, a material that is stable and of relatively low electric resistivity is used for the second metal layer among the metal materials. By using the material of relatively low electric resistivity, the resistivity of the metal pattern 125 itself can be lowered. As a result, it becomes possible to suppress the increase in the equivalent series resistance value of the crystal element 120. Further, with the use of the stable metal material for the second metal layer, the weight of the metal pattern 125 changes due to reaction with the air in the surrounding of the crystal element 120. As a result, changes in the frequency of the crystal element 120 can be decreased.

The excitation electrodes 126 are for applying voltages to the oscillation section 122. The excitation electrodes 126 are in a pair. One of the excitation electrodes 126 is provided on the top surface of the oscillation section 122 (the main surface of the first protruded section 122a), and the other excitation electrode 126 is provided on the bottom surface of the oscillation section 122 (the main surface of the second protruded section 122b). In a plan view of the crystal element 120, the excitation electrode 126 is in a substantially rectangular shape. Further, one of the excitation electrodes 126 is provided in such a manner that the outer edge thereof is located on the inner side than the outer edge of the first protruded section 122a, while the other excitation electrode 126 is provided in such a manner that the outer edge thereof is located on the inner side than the outer edge of the second protruded section 122b.

The wiring sections 127 are in a pair, which are for applying voltages to the excitation electrodes 126 and provided on the surface of the crystal element 121. One end of the wiring sections 127 is connected to the excitation electrode 126, and the other end is connected to the leading section 128 that is provided along a prescribed side of the crystal piece 121.

The leading sections 128 are connected to the wiring sections 127. In a case where the crystal element 120 is used as a crystal device, the leading sections 128 are electrically bonded to the loading pad 111 provided on the top surface of the base unit 110a via the conductive adhesive 140. The leading sections 128 are in a pair and provided side by side along a prescribed side of the crystal piece 121.

Now, a method for forming the metal pattern 125 constituted with the excitation electrodes 126, the wiring sections 127, and the leading sections 128 on the crystal piece 121 will be described. Herein, described is a case where the metal pattern 125 is formed integrally by using a photolithography technique and an etching technique. First, a crystal wafer in a state where the parts to be the crystal pieces 121 are connected is prepared, and a metal film to be the metal pattern 125 is formed on both main surface of the crystal wafer. Then, a photosensitive resist is applied on the metal film, and it is exposed and developed to a prescribed pattern. At this time, the photosensitive resist remains in the part to be the metal pattern 125 after development. Thereafter, the crystal wafer is soaked in a prescribed etching solution to remove the metal film in the part where no photosensitive resin remains and, at last, the remained photosensitive resist is removed. In the manner described above, the metal pattern 125 is formed in a prescribed part of the crystal piece 121. While the case of simultaneously forming the excitation electrodes 126, the wiring sections 127, and the leading sections 128 has been described, each of those may also be formed individually. Also, those may be formed using a sputtering technique, a vapor technique, or a combination of a photolithography technique and an etching technique, and a sputtering technique or a vapor technique without using a photolithography technique or an etching technique.

The crystal element 120 according to the exemplary embodiment includes: the crystal piece 121 in a substantially rectangular shape in a plan view, which includes the oscillation section 122 including the first protruded section 122a and the second protruded section 122b projected to the mutually opposing directions and the peripheral section 124 that is thinner than the oscillation section 122 and disposed along the outer edge of the oscillation section 122; a pair of excitation electrodes 126 provided on the top surface of the first protruded section 122a and the bottom surface of the second protruded section 122b; a pair of leading sections 128 provided side by side along a prescribed side of the crystal piece 121; and the wiring section 127 whose one end is connected to the excitation electrode 126 and the other end is connected to the leading section 128. Further, the first protruded section 122a includes: the first side face S11 that is sloping with respect to the top surface of the first protruded section 122a where the excitation electrode 126 is provided; and the second side face S12 that is opposing to the first side face S11 in a prescribed direction and opposing to the top surface of the first protruded section 122a where the excitation electrode 126 is provided. The second protruded section 122b includes: the third side face S13 that is sloping with respect to the bottom surface of the second protruded section 122b where the excitation electrode 126 is provided; and the fourth side face S14 that is opposing to the third side face S13 in a prescribed direction and opposing to the bottom surface of the second protruded section 122b where the excitation electrode 126 is provided. In a plan view in the thickness direction of the crystal piece 121, the first side face S11 is disposed to overlap with the third side face S13, while the second side face S12 is disposed to overlap with the fourth side face S14.

With this, when oscillation is propagated from the part sandwiched between the excitation electrodes 126 to the direction from the outer edge of the excitation electrodes 126 toward the outer edge of the oscillation section 122 in a plan view of the crystal element 120, the angle between the propagating direction and the side face (the first side face S11, the second side face S12, the third side face S13, or the fourth side face S14) can be made smaller compared to the case where the side face (the first side face S11, the second side face S12, the third side face S13, or the fourth side face S14) is perpendicular. Therefore, the amount reflected at the first side face S11, the second side face S12, the third side face S13, and the fourth side face S14 can be decreased, so that the deterioration amount of the electric characteristic caused by the oscillation reflected at the first side face S11, the second side face S12, the third side face S13, and the fourth side face S14 can be suppressed.

Further, in the crystal element 120 according to the exemplary embodiment, the first side face S11 is located on the positive direction side of the X-axis of the crystalline axes of the crystal piece 121 and in parallel to the surface perpendicular to the X-axis, the second side face S12 is located on the negative direction side of the X-axis of the crystalline axes of the crystal piece 121 and in parallel to the surface perpendicular to the X-axis, the third side face S13 is located on the positive direction side of the X-axis of the crystalline axes of the crystal piece 121 and in parallel to the surface perpendicular to the X-axis, and the fourth side face S14 is located on the negative direction side of the X-axis of the crystalline axes of the crystal piece 121 and in parallel to the surface perpendicular to the X-axis. That is, in the plan view of the crystal piece 121, the first side face S11 is located on the positive direction side with respect to the virtual line CLU which passes the center CU of the main surface of the first protruded section 122a and is perpendicular to the X-axis, the second side face S12 is located on the negative direction side with respect to the virtual line CLU which passes the center CU of the main surface of the first protruded section 122a and is perpendicular to the X-axis, the third side face S13 is located on the positive direction side with respect to the virtual line CLU which passes the center CU of the main surface of the second protruded section 122b and is perpendicular to the X-axis, and the fourth side face S14 is located on the negative direction side with respect to the virtual line CLU which passes the center CU of the main surface of the second protruded section 122b and is perpendicular to the X-axis.

With this, oscillation reflected at the side face (the first side face S11, the second side face S12, the third side face S13, or the fourth side face S14) can be decreased, so that the influence imposed upon the thickness slip vibration of the part sandwiched between the excitation electrodes 126 can be suppressed. Therefore, the deterioration amount of the electric characteristic can be suppressed. In general, when a voltage is applied to the excitation electrodes 126 and a part of the oscillation section 122 sandwiched between the excitation electrodes 126 is thickness-slip-vibrated, the vibration displacement becomes the greatest in the center part in the direction in parallel to the X-axis. Thus, the oscillation reflected and propagated from the side face in a direction in parallel to the X-axis tends to influence the thickness slip vibration of the part sandwiched between the excitation electrodes 126. That is, the embodiment is designed to locate the first side face S11 and the third side face S13 in the vertical direction and locate the second side dace S12 and the fourth side face S14 in the vertical direction in the sectional view taken along the XY' plane (the surface in parallel to the X-axis and the Y'-axis) so that the influence of the oscillation reflected at the side face (the first side face S11, the second side face S12, the third side face S13, or the fourth side face S14) imposed on the thickness slip vibration of the part sandwiched between the excitation electrodes 126 can be more decreased compared to the case where those are located in the vertical direction in the sectional view of the Z'Y' plane. So, the deterioration amount of the electric characteristic can be suppressed.

Further, in the crystal element 120 according to the exemplary embodiment, the angle between the top surface of the first protruded section 122a where the excitation electrode 126 is provided and the first side face S11 is larger than 90° and smaller than 180° °. Specifically, it is 135° to 155°. Further, the angle between the top surface of the first protruded section 122a where the excitation electrode 126 is provided and the second side face S12 is larger than 90° and smaller than 180°. Specifically, it is 150° to 170°. Furthermore, the angle between the bottom surface of the second protruded section 122b where the excitation electrode 126 is provided and the third side face S13 is larger than 90° and smaller than 180°. Specifically, it is 150° to 170°. Further, the angle between the bottom surface of the second protruded section 122b where the excitation electrode 126 is provided and the fourth side face S14 is larger than 90° and smaller than 180°. Specifically, it is 135° to 155°.

With this, when oscillation is propagated from the part sandwiched between the excitation electrodes 126 to the direction from the outer edge of the excitation electrodes 126 toward the outer edge of the oscillation section 122 in a plan view of the crystal element 120, the angle between the propagating direction and the side face (the first side face S11, the second side face S12, the third side face S13, or the fourth side face S14) can be made still smaller compared to the case where the side face (the first side face S11, the second side face S12, the third side face S13, or the fourth side face S14) is perpendicular. Therefore, the amount reflected at the first side face S11, the second side face S12, the third side face S13, and the fourth side face S14 can be decreased, so that the deterioration amount of the electric characteristic caused by the oscillation reflected at the first side face S11, the second side face S12, the third side face S13, and the fourth side face S14 can be suppressed further.

Further, in a plan view of the crystal element 120 according to the exemplary embodiment, the distance D11 (+) from a side which is perpendicular to the X-axis and is a prescribed other side of the crystal piece 121 located on the positive direction side of the X-axis to a side of the first side face S11 located on the positive direction side of the X-axis is shorter than the distance D11 (−) from the prescribed other side to the first side face S11 located on the negative direction side of the X-axis, and the distance D13 (+) to a side of the third side face S13 located on the positive direction side of the X-axis is shorter than the distance D11 (−) from the prescribed other side to the first side face S11 located on the negative direction side of the X-axis. Further, the distance D14 (+) from a prescribed other side to the fourth side face S14 located on the positive direction side of the X-axis is shorter than the distance D14 (−) from the prescribed other side to a side of the fourth side face S14 located on the negative direction side of the X-axis, and the distance D14 (+) from the prescribed other side to a side of the fourth side face S14 located on the positive direction side of the X-axis is shorter than the distance D12 (−) to a side of the second side face S12 located on the negative direction side of the X-axis. That is, in the crystal piece 121, assuming that the side perpendicular to the X-axis located on the positive direction side of the X-axis with respect to the virtual lines CLU and CLD is the prescribed other side of the crystal piece 121, the distance (D13 (+)) from the prescribed other side to the side of the third side face S13 close to the prescribed other side is shorter than the distance (D11 (−)) from the prescribed other side to the side of the first side face S11 distant from the prescribed other side, and the distance (D14 (+)) from the prescribed other side to the side of the fourth side face S14 close to the prescribed other side is shorter than the distance (D12 (−)) from the prescribed other side to the side of the second side face S12 distant from the prescribed other side.

With this, when oscillation is propagated from the part sandwiched between the excitation electrodes 126 to the direction from the outer edge of the excitation electrodes 126 toward the outer edge of the oscillation section 122 in a plan view of the crystal element 120, the angle between the propagating direction and the side face (the first side face S11, the second side face S12, the third side face S13, or the fourth side face S14) can be made smaller compared to the case where the side face (the first side face S11, the second side face S12, the third side face S13, or the fourth side face S14) is perpendicular. Therefore, the amount reflected at the first side face S11, the second side face S12, the third side face S13, and the fourth side face S14 can be decreased, so that the deterioration amount of the electric characteristic caused by the oscillation reflected at the first side face S11, the second side face S12, the third side face S13, and the fourth side face S14 can be suppressed.

In the crystal element 120 according to the exemplary embodiment, in a sectional view of the crystal piece 121 taken along the XY' plane (the plane in parallel to the X-axis and the Y'-axis), the distance D11 (−) from the prescribed other side of the crystal piece 121 to the first side face S11 located on the negative direction side of the X-axis and the distance D13 (−) from the prescribed other side of the crystal piece 121 to the third side face S13 located on the negative direction side of the X-axis are equivalent. Further, in the crystal piece 121, the distance D12 (+) from the prescribed other side of the crystal piece 121 to the second side face S12 located on the positive direction side of the X-axis and the distance D14 (+) from the prescribed other side of the crystal piece 121 to the fourth side face S14 located on the positive direction side of the X-axis are equivalent. That is, in the crystal piece 121, the distance (D11 (−)) from the prescribed other side to the side of the first side face S11 distant from the prescribed other side is equivalent to the distance (D13 (−)) from the prescribed other side to the side of the third side face S13 distant from the prescribed other side, and the distance (D14 (+)) from the prescribed other side to the side of the second side face S12 close to the prescribed other side is equivalent to the distance (D12 (+)) from the prescribed other side to the side of the fourth side face S14 close to the prescribed other side.

With such structure, in the perspective plan view of the crystal piece 120, the first side face S11 located on the negative direction side of the X-axis and the third side face S13 located on the negative direction side of the X-axis can overlap with each other while the second side face S12 located on the positive direction side of the X-axis and the fourth side face S14 located on the positive direction side of the X-axis can overlap with each other. Therefore, the amount reflected at the first side face S11, the second side face S12, the third side face S13, and the fourth side face S14 can be decreased. As a result, the deterioration amount of the electric characteristic caused by the oscillation reflected at the first side face S11, the second side face S12, the third side face S13, and the fourth side face S14 can be suppressed.

The crystal device according to the exemplary embodiment is constituted with: the crystal element 120 in such structure; the element loading member 110 to which the crystal element 120 is mounted; and the lid 130 that is bonded to the element loading member 110 and air-tightly seals the crystal element 120. This makes it possible to decrease changes in the electric characteristics caused when the oscillation propagated from a part of the crystal piece 121 sandwiched between the excitation electrodes 126 is reflected at the side faces of the first protruded section 122*a* and the second protruded section 122*b*. As a result, the equivalent series resistance value can be decreased.

The present invention is not limited only to the exemplary embodiment described above but may be embodied in various kinds of modes.

The crystal device having the crystal element is not limited to the crystal oscillator. For example, the crystal device may be an oscillator which includes, in addition to the crystal element, an integrated circuit element (IC) that generates oscillation signals by applying a voltage to the crystal element. Further, the crystal device may also be a device with a thermoset oven, for example. The structure of the element loading member for packaging the crystal element in the crystal device may be configured as appropriate. For example, the element loading member may be of an H-section type that includes recessed sections on the top surface and bottom surface thereof.

The shapes and sizes of the crystal element are not limited to those shown in the exemplary embodiment but may be set as appropriate. The shape of the excitation electrode is not limited to a substantially rectangular shape in a plan view. For example, the excitation electrode may be in an oval shape.

In a plan view of the crystal element, the centers of the first protruded section and the second protruded section may be consistent with the center of the crystal piece or may be decentered therefrom.

The virtual line passing through the center of the top surface of the oscillation section (the main surface of the first protruded section) in a plan view of the top surface of the crystal element and the virtual line passing through the center of the bottom surface of the oscillation section (the main surface of the second protruded section) in a perspective plan view of the bottom surface of the crystal element viewed from the top surface may or may not overlap with each other.

REFERENCE NUMERALS

110—Element loading member
110*a*—Base body
110*b*—Frame unit
111—Loading pad
112—External terminal
120—Crystal element
121—Crystal piece
122—Oscillation section
122*a*—First protruded section
122*b*—Second protruded section
123—Sloping section
123*a*—First slope
123*b*—Second slope
124—Peripheral section
125—Metal pattern
126—Excitation electrode
127—Wiring section
128—Leading section
130—Lid
140—Conductive adhesive
S11—First side face
S12—Second side face
S13—Third side face
S14—Fourth side face
D11 (+), D21 (+)—Distance between prescribed other side of crystal piece and side of first side face close to prescribed other side of crystal piece (distance from prescribed other side of crystal piece to first side face located on +X side)
D11 (−), D21 (−)—Distance between prescribed other side of crystal piece and side of first side face distant from prescribed other side of crystal piece (distance from prescribed other side of crystal piece to first side face located on −X side)
D12 (+), D22 (+)—Distance between prescribed other side of crystal piece and side of second side face close to prescribed other side of crystal piece (distance from prescribed other side of crystal piece to second side face located on +X side)
D12 (−), D22 (−)—Distance between prescribed other side of crystal piece and side of second side face distant from prescribed other side of crystal piece (distance from prescribed other side of crystal piece to second side face located on −X side)
D13 (+), D23 (+)—Distance between prescribed other side of crystal piece and side of third side face close to prescribed other side of crystal piece (distance from prescribed other side of crystal piece to third side face located on +X side)
D13 (−), D23 (−)—Distance between prescribed other side of crystal piece and side of third side face distant from prescribed other side of crystal piece (distance from prescribed other side of crystal piece to third side face located on −X side)
D14 (+), D24 (+)—Distance between prescribed other side of crystal piece and side of fourth side face close to prescribed other side of crystal piece (distance from prescribed other side of crystal piece to fourth side face located on +X side)
D14 (−), D24 (−)—Distance between prescribed other side of crystal piece and side of fourth side face distant from prescribed other side of crystal piece (distance from prescribed other side of crystal piece to fourth side face located on −X side)

What is claimed is:

1. A crystal element, comprising:
a crystal piece in a substantially rectangular shape in a plan view, which includes an oscillation section having a first protruded section and a second protruded section projected to mutually opposing directions and a peripheral section which is thinner than the oscillation section and provided along an outer edge of the oscillation section;
a pair of excitation electrodes provided on a top surface of the first protruded section and on a bottom surface of the second protruded section;
a pair of leading sections provided side by side along a prescribed side of the crystal piece; and
a wiring section whose one end is connected to the excitation electrode and other end is connected to the leading section, wherein:
the first protruded section includes a first planar side face extending directly from the top surface of the first protruded section to a top surface of the peripheral section and that is sloping with respect to the top surface of the first protruded section where the excitation electrode is provided, and a second planar side face extending directly from the top surface of the first protruded section to the top surface of the peripheral section and which is opposing to the first side face in a prescribed direction and opposing to the top surface of the first protruded section where the excitation electrode is provided;

the second protruded section includes a third planar side face extending directly from the bottom surface of the second protruded section to a bottom surface of the peripheral section and that is sloping with respect to the bottom surface of the second protruded section where the excitation electrode is provided, and a fourth planar side face extending directly from the bottom surface of the second protruded section to the bottom surface of the peripheral section and which is opposing to the third side face in a prescribed direction and opposing to the bottom surface of the second protruded section where the excitation electrode is provided;

the first side face is disposed to overlap with the third side face in a plan view of the crystal piece in a thickness direction; and the second side face is disposed to overlap with the fourth side face in the plan view of the crystal piece in the thickness direction;

wherein an angle between the top surface of the first protruded section where the excitation electrode is provided and the first planar side face is larger than 135° and smaller than 155°;

an angle between the top surface of the first protruded section where the excitation electrode is provided and the second planar side face is larger than 150° and smaller than 170°;

an angle between the bottom surface of the second protruded section where the excitation electrode is provided and the third planar side face is larger than 150° and smaller than 170°; and an angle between the bottom surface of the second protruded section where the excitation electrode is provided and the fourth planar side face is larger than 135° and smaller than 155°.

2. The crystal element as claimed in claim 1, wherein, in a plan view:

the first side face is located on a positive direction side of an X-axis with respect to a virtual line which passes through a center of a main surface of the first protruded section and is perpendicular to the X-axis of crystalline axes of the crystal piece;

the second side face is located on a negative direction side of the X-axis with respect to the virtual line which passes through the center of the main surface of the first protruded section and is perpendicular to the X-axis;

the third side face is located on the positive direction side of the X-axis with respect to a virtual line which passes through a center of a main surface of the second protruded section and is perpendicular to the X-axis; and the fourth side face is located on the negative direction side of the X-axis with respect to the virtual line which passes through the center of the main surface of the second protruded section and is perpendicular to the X-axis.

3. The crystal element as claimed in claim 2, wherein, provided that a side which is perpendicular to the X-axis located on the positive direction side of the X-axis with respect to the virtual line is a prescribed other side of the crystal piece in a plan view of the crystal element:

a distance between the prescribed other side and a side of the third side face close to the prescribed other side is shorter than a distance between the prescribed other side and a side of the first side face distant from the prescribed other side; and a distance between the prescribed other side and a side of the fourth side face close to the prescribed other side is shorter than a distance between the prescribed other side and a side of the second side face distant from the prescribed other side.

4. The crystal element as claimed in claim 3, wherein:

a distance between the prescribed other side and the side of the first side face distant from the prescribed other side is equivalent to a distance between the prescribed other side and the side of the third side face distant from the prescribed other side; and a distance between the prescribed other side and the side of the second side face close to the prescribed other side is equivalent to a distance between the prescribed other side and the side of the fourth side face close to the prescribed other side.

5. A crystal device, comprising:

the crystal element as claimed in claim 1;

an element loading member to which the crystal element is mounted; and a lid which is bonded to the element loading member for air-tightly sealing the crystal element.

* * * * *